(12) United States Patent
Jumeau et al.

(10) Patent No.: US 12,432,864 B2
(45) Date of Patent: Sep. 30, 2025

(54) SEALING STRUCTURE FOR AN EXPLOSION-PROOF OVER-TEMPERATURE AND OVER-CURRENT PROTECTOR

(71) Applicant: JPCI Controls (Foshan Gaoming) Co., Ltd., Foshan (CN)

(72) Inventors: Gregoire Louis Jumeau, Trilbardou (FR); Yongbo Xiao, Foshan (CN)

(73) Assignee: JPCI CONTROLS (FOSHAN GAOMING) CO., LTD., Foshan (CN)

( * ) Notice: Subject to any disclaimer, the term of this patent is extended or adjusted under 35 U.S.C. 154(b) by 212 days.

(21) Appl. No.: 18/450,138

(22) Filed: Aug. 15, 2023

(65) Prior Publication Data

US 2024/0397645 A1 Nov. 28, 2024

(30) Foreign Application Priority Data

May 23, 2023 (CN) .......................... 202310587745.1

(51) Int. Cl.
*H05K 5/02* (2006.01)
*H05K 5/06* (2006.01)

(52) U.S. Cl.
CPC ......... *H05K 5/0209* (2022.08); *H05K 5/0213* (2013.01); *H05K 5/0247* (2013.01); *H05K 5/062* (2013.01)

(58) Field of Classification Search
None
See application file for complete search history.

(56) References Cited

U.S. PATENT DOCUMENTS

| 2,225,945 | A | * | 12/1940 | Appleton | ............... | H01H 9/042 |
| | | | | | | 220/288 |
| 3,944,437 | A | * | 3/1976 | Auerbach | ............. | H01M 10/52 |
| | | | | | | 429/82 |

(Continued)

FOREIGN PATENT DOCUMENTS

| CN | 104217896 A | 12/2014 |
| CN | 107346718 A | 11/2017 |

(Continued)

OTHER PUBLICATIONS

Original and Translation of CN106486326 (Year: 2017).*

(Continued)

*Primary Examiner* — Timothy J. Dole
*Assistant Examiner* — Muhammed Azam
(74) *Attorney, Agent, or Firm* — Muncy, Geissler, Olds & Lowe, P.C.

(57) ABSTRACT

A sealing structure for an explosion-proof over-temperature and over-current protector, comprising an over-temperature and over-current protector, an explosion-proof pouring compound, a switch contact protective housing, and an externally protective case; wherein the externally protective case is a relatively closed case which wraps up the explosion-proof pouring compound completely so as to prevent the explosion-proof pouring compound from being exposed to the ultraviolet light, thus the protector can be used in the environment having ultraviolet light; the sealing structure further comprises a cable electrically connected with the over-temperature and over-current protector, wherein the externally protective case is provided with a cable hole having an inward rounded edge.

9 Claims, 4 Drawing Sheets

(56) References Cited

U.S. PATENT DOCUMENTS

| | | | | |
|---|---|---|---|---|
| 3,974,933 | A * | 8/1976 | Toth | E05B 65/006 220/88.1 |
| 4,156,891 | A * | 5/1979 | Roche | F21V 25/12 362/267 |
| 4,213,018 | A * | 7/1980 | Piston | H01R 13/527 200/293 |
| 4,841,418 | A * | 6/1989 | Davis | F21V 23/02 362/223 |
| 5,821,695 | A * | 10/1998 | Vilanilam | F21V 21/043 315/71 |
| 6,331,674 | B1 * | 12/2001 | Zolock | G01F 1/8409 174/64 |
| 6,392,322 | B1 * | 5/2002 | Mares | H02K 11/33 310/12.32 |
| 6,905,362 | B2 * | 6/2005 | Williams | H01M 10/46 439/924.1 |
| 7,102,483 | B2 | 9/2006 | Hwang et al. | |
| 7,176,655 | B2 * | 2/2007 | Kogan | G06F 1/1635 320/112 |
| 7,238,055 | B2 * | 7/2007 | Mundry | H05K 7/1464 439/638 |
| 8,227,692 | B2 * | 7/2012 | Dahlgren | H05K 5/061 361/666 |
| 8,498,099 | B1 * | 7/2013 | Schmuckle | H05K 5/0018 361/679.01 |
| 8,754,341 | B2 * | 6/2014 | Manahan | H01H 13/06 200/332 |
| 8,821,622 | B2 * | 9/2014 | Manahan | B01D 46/46 55/482 |
| 9,366,058 | B2 * | 6/2016 | Zhao | B65D 45/16 |
| 9,472,369 | B2 * | 10/2016 | Dozier | H02P 1/26 |
| 9,537,181 | B2 * | 1/2017 | Ahn | H01M 10/4257 |
| 9,668,385 | B2 * | 5/2017 | Manahan | H02B 1/28 |
| 10,129,993 | B2 * | 11/2018 | Tollefsbol | H05K 5/068 |
| 10,461,481 | B2 * | 10/2019 | Hieda | H01R 27/02 |
| 10,709,025 | B2 * | 7/2020 | Lee | H05K 5/03 |
| 10,980,141 | B2 * | 4/2021 | Coenegracht | H05K 5/0221 |
| 11,456,609 | B1 * | 9/2022 | Thiel | H01R 13/625 |
| 11,469,528 | B1 * | 10/2022 | Wu | H05K 5/03 |
| 11,627,674 | B2 * | 4/2023 | Hermanowski | H02B 1/28 220/88.2 |
| 2005/0156001 | A1 * | 7/2005 | Dal Pra | B62J 11/19 280/281.1 |
| 2010/0231142 | A1 * | 9/2010 | Yoon | F21L 4/027 362/184 |
| 2010/0258331 | A1 * | 10/2010 | Dahlgren | G01D 11/24 174/50.54 |
| 2010/0297488 | A1 * | 11/2010 | Tajima | H01M 50/383 429/120 |
| 2012/0160582 | A1 * | 6/2012 | Strock | H01M 50/20 180/68.5 |
| 2023/0104209 | A1 * | 4/2023 | Lorenz | H01M 10/625 429/82 |
| 2024/0063443 | A1 * | 2/2024 | Kang | B60R 16/0207 |

FOREIGN PATENT DOCUMENTS

| | | |
|---|---|---|
| CN | 108010821 A | 5/2018 |
| CN | 212648132 U | 3/2021 |

OTHER PUBLICATIONS

Original and Translation of BR112013025210 (Year: 2021).*
Original and Translation of CN116682694 (Year: 2023).*
Original and Translation of CN218631811 (Year: 2023).*
Original and Translation of CN219303558 (Year: 2023).*
Original and Translation of CN219476606 (Year: 2023).*
Original and Translation of DE4312736 (Year: 1994).*
Original and Translation of NL1037176 (Year: 2011).*
Original and Translation fo CN101784174 (Year: 2014).*
Original and Translation of WO2005025285 (Year: 2005).*
Original and Translation of CN203050257 (Year: 2013).*
Original and Translation of CN203326002 (Year: 2013).*
Original and Translation of CN205050898 (Year: 2016).*
Original and Translation of CN203050257 (Year: 2004).*

* cited by examiner

SEALING STRUCTURE FOR AN EXPLOSION-PROOF OVER-TEMPERATURE AND OVER-CURRENT PROTECTOR

CROSS-REFERENCE TO RELATED APPLICATIONS

This application claims priority to Chinese application No. 202310587745.1 having a filing date of May 23, 2023, the entire contents of foresaid documents are hereby incorporated by reference.

TECHNICAL FIELD

The following relates to a field of an explosion-proof over-temperature and over-current protector, in particular to a sealing structure for an explosion-proof over-temperature and over-current protector.

BACKGROUND OF INVENTION

Various electrical instruments are used in the production process, where friction sparks, mechanical wear sparks, electrostatic sparks, high temperature environment are inevitable, especially when some instruments and/or electrical faults occur. On some industrial sites where an explosion may occur when the concentration of the mixture of explosive substance and oxygen is within an explosive range while there is a source which may cause an explosion. Therefore, it is necessary to take explosion-proof measures at the industrial sites.

The current explosion-proof products do not have a complete external shell protection due to the efficiency of assembly, so that the explosion-proof pouring compound is partially exposed to the environment. Currently, the pouring compound with good thermal stability on the market has poor ultraviolet resistance, so the existing explosion-proof products cannot be directly used in the environment with ultraviolet irradiation.

SUMMARY OF THE INVENTION

To overcome the shortcoming of the prior art, provided herein is a sealing structure for an explosion-proof over-temperature and over-current protector which is more reliable during long-term operation, more accurate in temperature detection, and has better quality without potential explosion risk caused by any damage.

To solve the above technical problem, the present disclosure is achieved by the following solution:

A sealing structure for an explosion-proof overtemperature and overcurrent protector, comprising an over-temperature and over-current protector, a cable electrically connected with the over-temperature and over-current protector, an explosion-proof pouring compound, a switch contact protective housing and an externally protective case, wherein the externally protective case is a relatively closed case which wraps up the explosion-proof pouring compound completely, and the externally protective case is provided with a cable hole having an inwardly rounded edge.

Further, one end of the switch contact protective housing is open, and its other end is closed; the externally protective case is open at one end away from the cable hole, wherein an end cover is provided at the open end of the externally protective case; the switch contact protective housing is provided with a first pin hole, the externally protective case is provided with a second pin hole, and the end cover is provided with a third pin hole; during assembly, the first pin hole, the second pin hole and the third pin hole are aligned and a pin goes through said three holes to fix the housing, the case and the cover.

Further, the switch contact protective housing is provided with a protrusion, and the end cover is provided with an engaging hole which fits with the protrusion so as to engage the switch contact protective housing with the end cover.

Further, the cable comprises a positive and negative lead bypassing the overtemperature and overcurrent protector along its two sides respectively.

Further, the switch contact protective housing is made of thermally conductive ceramic material.

Further, the switch contact protective housing is made of ceramic material with a thermal conductivity greater than 15 W/m·K.

Further, the diameter size of the cable hole is matched with the size of the cross-section of the cable.

Further, a cable channel is centrally configured protruding outwardly on one side of the switch contact protective housing, and a groove, being corresponding to the cable channel, is also configured protruding outwardly on the externally protective case.

Further, the externally protective case is provided with a fourth pin hole within which a positioning pin is provided.

Further, the externally protective case is also provided with an injection hole and an outlet hole at the end where the cable hole is provided.

Compared with the prior art, the beneficial effect of the present disclosure is that, a sealing structure for an explosion-proof over-temperature and over-current protector, comprising an over-temperature and over-current protector, an explosion-proof pouring compound, a switch contact protective housing, and an externally protective case; wherein the externally protective case is a relatively closed case which wraps up the explosion-proof pouring compound completely so as to prevent the explosion-proof pouring compound from being exposed to the ultraviolet light, thus the protector can be used in the environment having ultraviolet light; the sealing structure further comprises a cable electrically connected with the over-temperature and over-current protector, wherein the externally protective case is provided with a cable hole having an inward rounded edge, the cable insulation layer is therefore protected from damages caused by sharp edges, thereby achieving better reliability of product.

In general, such structure makes the product more reliable, having higher accuracy to detect the temperature and longer lifespan. The product is more convenient to use, more economical and practical, meanwhile the assembly time is greatly reduced, and the production efficiency and quality is greatly improved.

BRIEF DESCRIPTION OF DRAWINGS

The figures are provided hereinafter for better understanding to the present invention. The figures and the embodiments of the present invention provide an explanation of the invention, but do not institute any limitation to the invention, wherein.

Reference Numeric:

| | |
|---|---|
| 1- cable | 2- over-temperature and over-current protector |
| 3- pin | 4- switch contact protective housing |
| 5- explosion-proof pouring compound | 6- externally protective case |
| 7- outer surface of case 6 | 8- cable hole |
| 9- switch terminal | 10- positive lead and negative lead |
| 11- cable channel | 12- groove |
| 13- end cover | 14- first pin hole |
| 15- second pin hole | 16- third pin hole |
| 17- protrusion | 18- positioning pin |
| 19- fourth pin hole | 20- engaging hole |
| 21- injection hole | 22- outlet hole |

DETAILED DESCRIPTION OF THE INVENTION

Preferred embodiments of the present invention are described in detail hereinafter with reference to the figures, it will be appreciated that the preferred embodiments are merely for illustrating and explaining the present invention, and are not intended to limit the invention.

Figure 2:
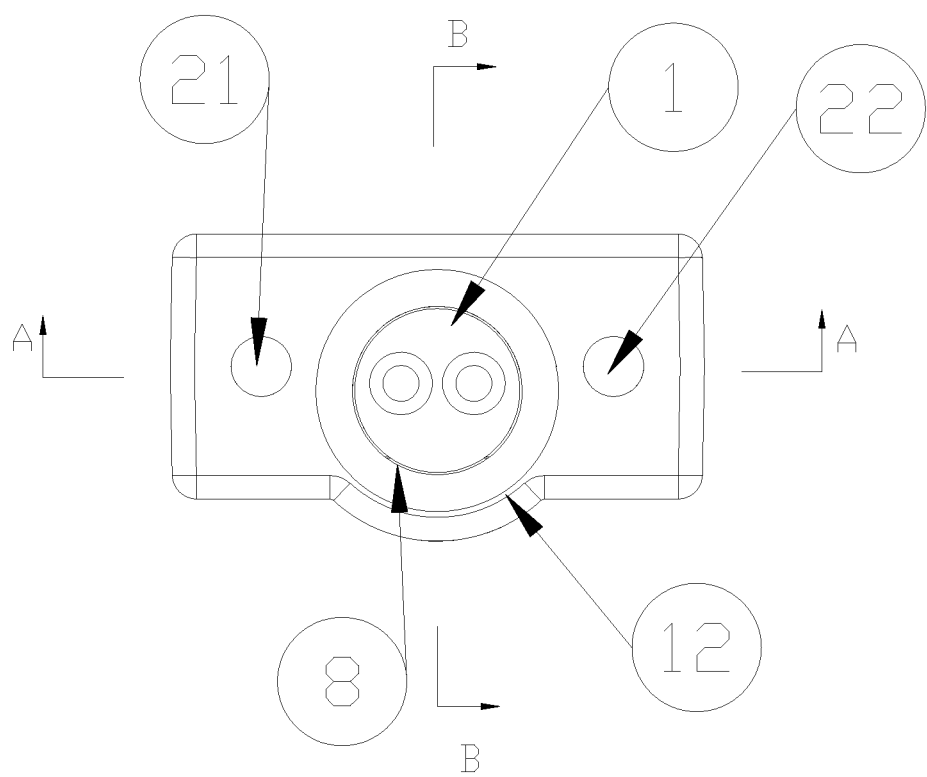
FIG. 2 is a schematic top view of the sealing structure for an explosion-proof over-temperature and over-current protector according to an embodiment of the present disclosure.
Figure 3:
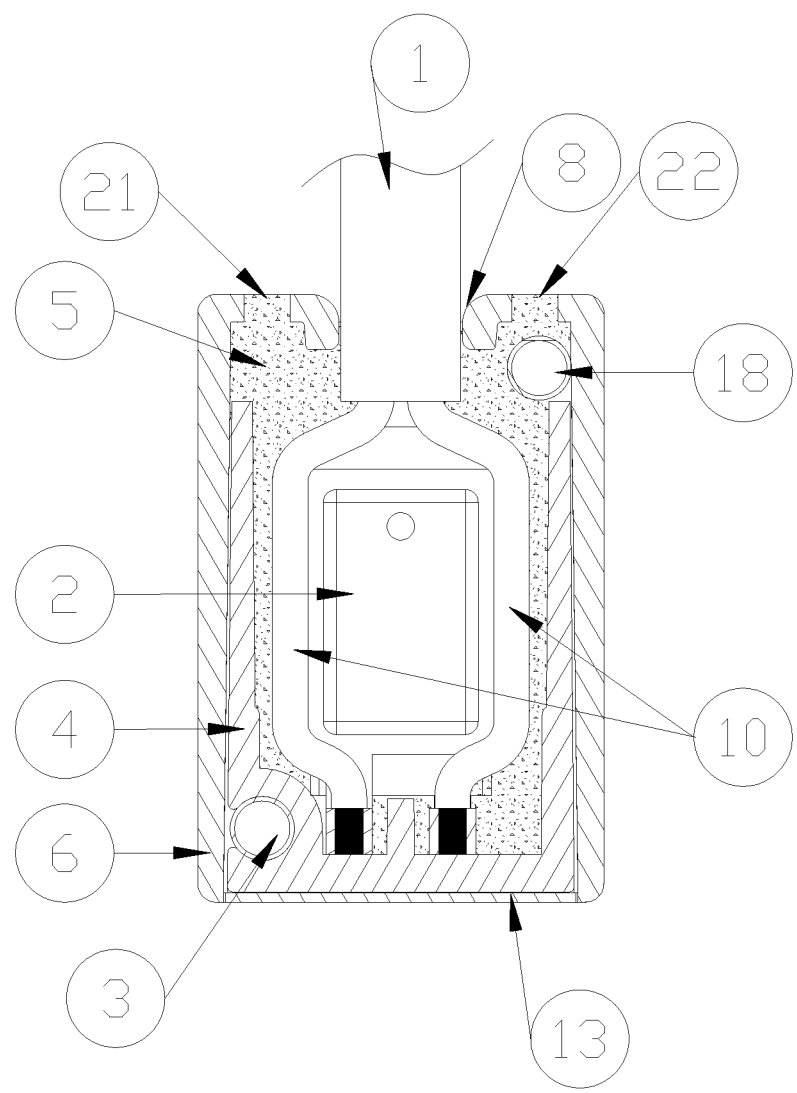
FIG. 3 is a cross-section view taken along line A-A in FIG. 2.
Figure 4:
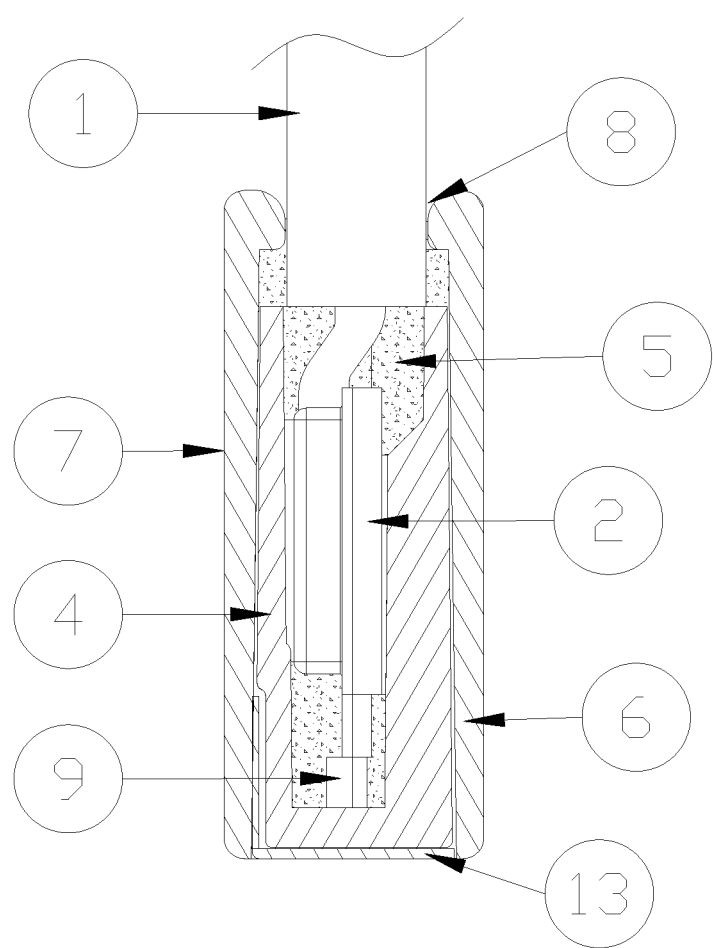
FIG. 4 is a cross-section view taken along line B-B in FIG. 2.

As shown in FIG. 1 to FIG. 4, provided is a sealing structure for an explosion-proof over-temperature and over-current protector, comprising an over-temperature and over-current protector 2, an explosion-proof pouring compound 5, a switch contact protective housing 4 and an externally protective case 6. The switch contact protective housing 4 is made of thermally conductive ceramic material, e.g., with a thermal conductivity greater than 15 W/m·K, which make heat-transfer faster from an outer surface 7 to an internal temperature-sensing element, and temperature detection accuracy higher, as shown in FIG. 4. Ceramic is a material having high temperature resistance and excellent performance of electrical insulation. Said ceramic material includes various thermally conductive ceramic materials, and is not limited to a certain.

As shown in FIG. 3, the structure further comprises a cable 1 electrically connected with the over-temperature and over-current protector 2, the cable 1 comprises a positive and negative leads 10 bypassing the over-temperature and over-current protector 2 along its two sides respectively. The two leads are diverted by a housing of a temperature limiter for faster heat dissipation. The insulation layer of the leads is wrapped by the insulated explosion-proof pouring compound 5, thereby achieving better insulation.

Figure 1:
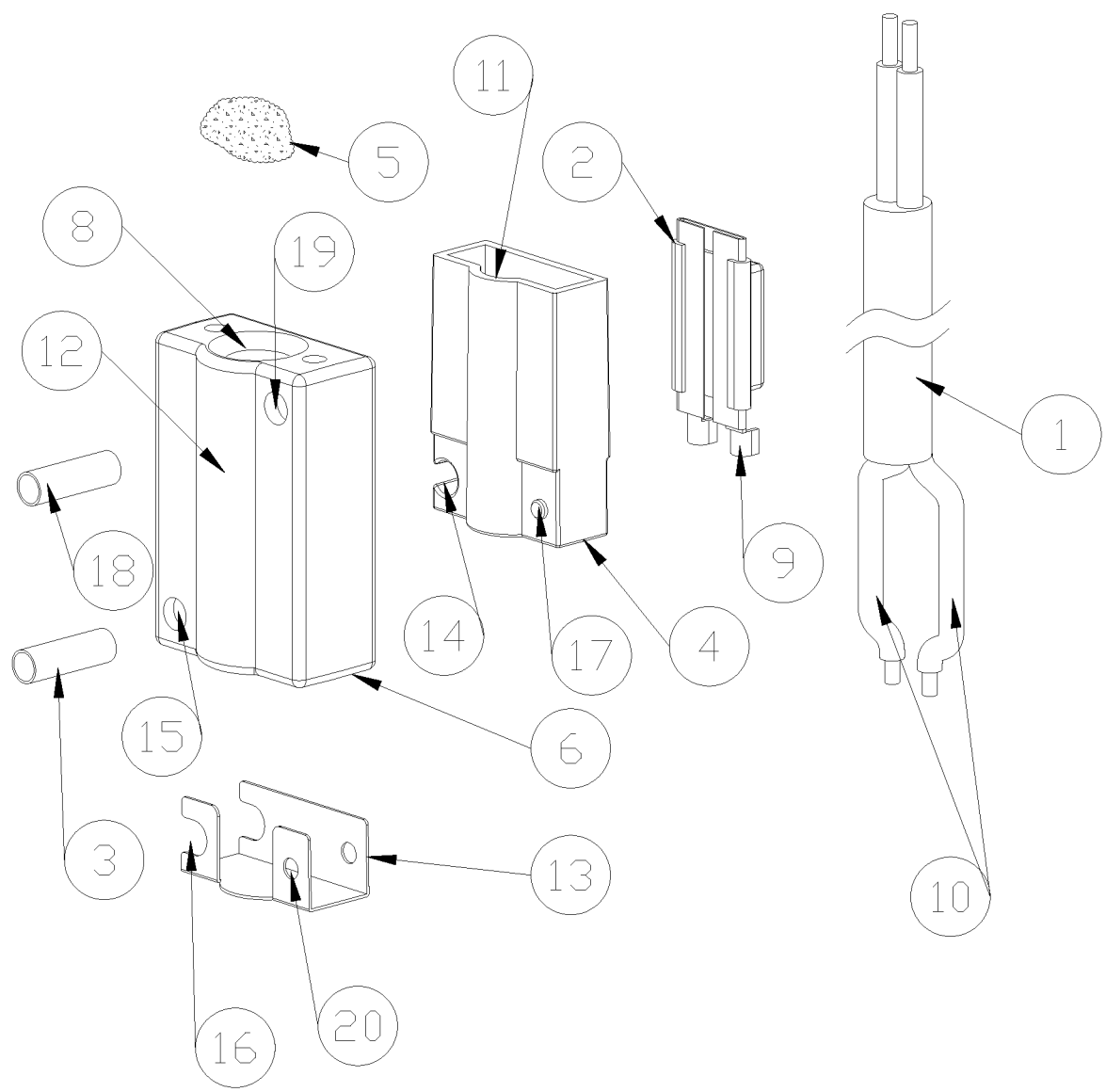
FIG. 1 is an exploded view of a sealing structure for an explosion-proof over-temperature and over-current protector according to an embodiment of the present disclosure.

As shown in FIG. 1 and FIG. 2, a cable channel 11 is centrally configured protruding outwardly on one side of the switch contact protective housing 4, accordingly a groove 12, being corresponding to the cable channel 11, is also configured protruding outwardly on the externally protective case 6, and therefore the protector can be designed as thin as possible except the cable channel 11 so as to miniaturize the product.

As shown in FIG. 1, during the assembly of the switch contact protective housing 4 and the externally protective case 6, the cable channel 11 can be aligned with and slide in the groove 12, this plays the role of positioning when the switch contact protective housing 4 is inserted into the externally protective case 6, thereby improving assembly efficiency.

As shown in FIG. 3 and FIG. 4, the externally protective case 6 is a relatively closed case which wraps up the explosion-proof pouring compound 5 completely so as to prevent the explosion-proof pouring compound 5 from being exposed to the ultraviolet light, thus the protector can be used in the environment having ultraviolet light.

As shown in FIG. 1, FIG. 3 and FIG. 4, one end of the switch contact protective housing 4 is open, and its other end is closed. The externally protective case 6 is open at one end away from a cable hole 8, where an end cover 13 is provided at the open end of the externally protective case 6.

As shown in FIG. 1, the switch contact protective housing 4 is provided with a first pin hole 14, the externally protective case 6 is provided with a second pin hole 15, and the end cover 13 is provided with a third pin hole 16. When assembling the housing 4, the case 6 and the cover 13 together, the first pin hole 14, the second pin hole 15 and the third pin hole 16 are aligned and a pin 3 goes through all holes to fix the housing 4, the case 6 and the cover 13. The switch contact protective housing 4 is provided with a protrusion 17, and the end cover 13 is provided with an engaging hole 20 which fits with the protrusion 17 so as to engage the switch contact protective housing 4 with the end cover 13. The externally protective case 6 is provided with a fourth pin hole 19 within which a positioning pin 18 is provided to limit the position of switch contact protective housing 4.

As shown in FIG. 2 and FIG. 4, the externally protective case 6 is provided with a cable hole 8 whose diameter is slightly larger than the diameter of the cable 1. Thus, the cable 1 is firmly secured to prevent from damage caused by its looseness, making the product more reliable. Further, the cable hole 8 is provided with an inwardly rounded edge so that the insulation layer of the cable 1 is therefore protected from damages caused by sharp edge, thereby achieving better reliability of the product. The externally protective case 6 is also provided with an injection hole 21 for injecting the explosion-proof pouring compound 5 into the externally protective case 6, and an outlet hole 22 for expelling air from the externally protective case 6, at the end where the cable hole 8 is provided.

As shown in FIG. 1 to FIG. 4, during assembly of the sealing structure, firstly, connect the positive and negative leads 10 of the cable 1 to two switch terminals 9 of the over-temperature and over-current protector 2, ensuring that the positive lead 10 and the negative lead 10 bypass the over-temperature and over-current protector 2 along its two sides respectively, and put the package of the cable 1 and the protector 2 into the switch contact protective housing 4; then pass the cable 1 through the cable hole 8 of the externally protective case 6, and clamp the end cover 13 onto the switch contact protective housing 4, insert the positioning pin 18 into the fourth pin hole 19, then insert the package of the switch contact protective housing 4 and the end cover 13 into externally protective case 6 from the open end thereof, while align the groove 12 with the cable channel 11, and the cable channel 11 slides into the groove 12 until the end of the switch contact protective housing 4 abuts against the positioning pin 18 inside the fourth pin hole 19, at that time, the first pin hole 14, the second pin hole 15 and the third pin hole 16 are aligned, then insert the pin 3 into the first pin hole 14, the second pin hole 15 and the third pin hole 16 in order to retain whole over-temperature and over-current protector 2, further inject the liquid explosion-proof pouring compound 5 into the externally protective case 6 from the injection hole 21, while the air inside the case 6 is expelled from the outlet hole 22, finally the explosion-proof pouring compound 5 is cooled and solidified, the assembly is accomplished.

In general, such structure makes the product more reliable, having higher accuracy to detect the temperature and longer lifespan. The product is more convenient to use, more economical and practical, meanwhile the assembly time is greatly reduced, and the production efficiency and quality is greatly improved.

It should be appreciated, the embodiment described hereinbefore is merely preferred embodiment of the present invention and not for purposes of any restrictions or limitations on the invention. It will be apparent that any non-substantive, obvious alterations or improvement by the technician of this technical field according to the present invention may be incorporated into the ambit of claims of the present invention.

For the sake of clarity, it is to be understood that the use of 'a' or 'an' throughout this application does not exclude a plurality, and 'comprising' does not exclude other steps or elements.

What is claimed:

1. A sealing structure for an explosion-proof over-temperature and over-current protector, comprising an over-temperature and over-current protector, a cable electrically connected with the over-temperature and over-current protector, an explosion-proof pouring compound, a switch contact protective housing and an externally protective case, wherein the externally protective case is a relatively closed case which wraps up the explosion-proof pouring compound completely, and the externally protective case is provided with a cable hole having an inwardly rounded edge;

wherein one end of the switch contact protective housing is open, and its other end is closed; the externally protective case is open at one end away from the cable hole, wherein an end cover is provided at the open end of the externally protective case; the switch contact protective housing is provided with a first pin hole, the externally protective case is provided with a second pin hole, and the end cover is provided with a third pin hole; during assembly, the first pin hole, the second pin hole and the third pin hole are aligned and a pin goes through said three pin holes to fix the housing, the case and the end cover.

2. The sealing structure of claim 1, wherein the switch contact protective housing is provided with a protrusion, and the end cover is provided with an engaging hole which fits with the protrusion so as to engage the switch contact protective housing with the end cover.

3. The sealing structure of claim 1, wherein the cable comprises a positive and negative leads bypassing the over-temperature and over-current protector along its two sides respectively.

4. The sealing structure of claim 1, wherein the switch contact protective housing is made of thermally conductive ceramic material.

5. The sealing structure of claim 4, wherein the switch contact protective housing is made of ceramic material with a thermal conductivity greater than 15 W/m·K.

6. The sealing structure of claim 1, wherein a diameter of the cable hole is slightly larger than a diameter of the cable.

7. The sealing structure of claim 1, wherein a cable channel is centrally configured protruding outwardly on one side of the switch contact protective housing, and a groove, being corresponding to the cable channel, is also configured protruding outwardly on the externally protective case.

8. The sealing structure of claim 1, wherein the externally protective case is provided with a fourth pin hole within which a positioning pin is provided.

9. The sealing structure of claim 1, wherein the externally protective case is also provided with an injection hole and an outlet hole at an end where the cable hole is provided.

\* \* \* \* \*